(12) United States Patent
Behziz et al.

(10) Patent No.: US 7,180,321 B2
(45) Date of Patent: Feb. 20, 2007

(54) TESTER INTERFACE MODULE

(75) Inventors: Arash Behziz, Thousand Oaks, CA (US); Keith Breinlinger, Pleasanton, CA (US); David Evans, Thousand Oaks, CA (US); Frank Parrish, Simi Valley, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 11/235,951

(22) Filed: Sep. 27, 2005

(65) Prior Publication Data

US 2006/0071680 A1 Apr. 6, 2006

Related U.S. Application Data

(60) Provisional application No. 60/695,516, filed on Jun. 30, 2005, provisional application No. 60/615,435, filed on Oct. 1, 2004.

(51) Int. Cl.
*G01R 31/26* (2006.01)

(52) U.S. Cl. ...................................... 324/765

(58) Field of Classification Search ...................... None
See application file for complete search history.

(56) References Cited

U.S. PATENT DOCUMENTS

| | | | |
|---|---|---|---|
| 5,525,911 A | 6/1996 | Marumo et al. | |
| 5,534,787 A | 7/1996 | Levy et al. | |
| 6,264,476 B1 | 7/2001 | Li et al. | |
| 6,420,888 B1 | 7/2002 | Griffin et al. | |
| 6,515,499 B1 | 2/2003 | Parrish et al. | |
| 6,551,126 B1* | 4/2003 | Feldman | 439/482 |
| 6,686,732 B2 | 2/2004 | Parrish | |
| 6,864,696 B2* | 3/2005 | Logelin et al. | 324/754 |

* cited by examiner

*Primary Examiner*—Jermele Hollington
*Assistant Examiner*—Trung Q Nguyen
(74) *Attorney, Agent, or Firm*—Christopher R. Balzan, Esq.

(57) ABSTRACT

In one embodiment, a tester interface module for connecting a plurality of signal paths from at least one electronic assembly to at least one other electronic assembly is provided. The interface module includes a capture board having center conductor vias with center conductor holes extending through the capture board. Axial cables secured to the capture board have center conductors extending at least part way through a corresponding center conductor hole of the center conductor via. An interface component is adjacent to the capture board, the conductor paths being conductively bonded to the conductor vias of the capture board so as to electrically connect center conductors to corresponding conductor paths. The conductor paths of the interface component are arranged to allow connection with an electronic assembly.

37 Claims, 5 Drawing Sheets

TESTER INTERFACE MODULE

CROSS REFERENCE TO RELATED APPLICATION

This application claims the benefit of U.S. Provisional application 60/615,435, by Behziz, et al., entitled TESTER INTERFACE MODULE, filed Oct. 1, 2004; and of U.S. Provisional application 60/695,516, by Behziz, et al., entitled CONNECTOR-TO-PAD PRINTED CIRCUIT BOARD TRANSLATOR AND MEHTOD OF FABRICATION; filed Jun. 30, 2005; both herein incorporated by reference in their entireties.

BACKGROUND

Sophisticated electronic assemblies often employ dense arrays of electrical conductors to deliver signals from one area to another. Routing large groups of conductors in an efficient and organized manner often proves problematic for a variety of reasons. The overall assembly cost, form factor (size), conductor pitch, and complexity all typically must be taken into account to determine a suitable routing method.

For high performance semiconductor testers, sometimes referred to as automated test equipment or ATE, tester signals up to several gigahertz are funneled and delivered from relatively large circuit boards known as channel cards, to the leads of a very compact device under test or DUT. Often, several thousand signal paths provide the signal delivery scheme between the DUT and the tester electronics. In order to preserve fidelity for such high-frequency signals, the signal paths are constructed to provide as close to a matched fifty-ohm impedance as possible. Providing a closely matched impedance with a large number of signal paths is difficult.

One proposal for efficiently routing high performance signals in an automated test equipment interface is disclosed in U.S. Pat. No. 6,515,499, by Parrish, et al., entitled MODULAR SEMICONDUCTOR TESTER INTERFACE ASSEMBLY FOR HIGH PERFORMANCE COAXIAL CONNECTIONS, issued Feb. 4, 2003; assigned to Teradyne, Inc., Boston, Mass., herein incorporated by reference in its entirety. Generally, this proposal discloses a harness assembly for interfacing a plurality of semiconductor pin electronics circuits to a compliant interconnect array disposed on a device interface board or DIB. The harness assembly includes a plurality of cables having shield and center conductor distal tips that terminate in a housing. The distal tips of the cables are formed to define an interface engagement plane.

While this proposal above is beneficial for its intended purposes, the shield and center conductor contact structures are susceptible to a problem known as "pistoning", due to the direct contact of the structures to the compliant array or interposer, and from bending of the cable. Pistoning involves the relative axial displacement of the center conductor with respect to the shield conductor. In some instances, if the pistoning problem is too great, the contact surfaces of the shield/signal conductors may be unable to touch the compliant interposer or the 50 ohm signal will be distorted. Complex contact configuration could address the problem, but at an undesirable cost when considering the thousands of connections involved.

One possible solution to the pistoning problem is disclosed in U.S. Pat. No. 6,686,732, by Frank Parrish, entitled LOW-COST TESTER INTERFACE MODULE, issued Feb. 3, 2004, assigned to Teradyne, Inc., Boston, Mass., herein incorporated by reference in its entirety. One disclosed form of the low-cost tester interface module provides a stiffener formed with a rectangular conductive body having an array of through-bores to receive coaxial cables. A signal transition assembly is bonded to the stiffener. The center conductors extend through drilled signal holes in the signal transition assembly, and are soldered therewith. After the signal conductors are installed and soldered, the DIB side of the signal transition assembly is milled to a desired flatness. The signal transition assembly is then plated to provide signal contacts. Although this tester interface provides high fidelity signals at low cost, because there can be thousands or more connections from a tester electronics card to a DIB, still lower cost, high fidelity, high frequency alternatives could further reduce the overall cost of the ATE.

Typically, a high performance machined connector is required to mate to a printed circuit board. A current state of the art high performance interface tends to cost around $50–$100 per line. Specific to the ATE market, these expensive connectors may be terminated to a printed circuit board or metal block, as discussed above, with pogo pins or other types of compliant interposers (such as FUJIPOLY ELASTOMERICS, by Fujipoly America, Carteret, N.J. or MPI by Tyco Electronics, Corp., wwww.tycoelectronics.com; C-LGA by InterCon Systems of Harrisburg, Pa.) being used to blind mate connect to the DIB. Such connectors also may be used to mate to any DIB variation, i.e., handler interface board or HIB, prober interface board or PIB, etc., or to other custom printed circuit boards or PCBs.

What is needed is a tester interface module capable of delivering high frequency, high fidelity signals at lower cost. Moreover, what is needed is a still lower cost method for manufacturing a tester interface module capable of high frequency and high fidelity.

SUMMARY

In one embodiment, a tester interface module for connecting a plurality of signal paths from an electronic assembly to an other electronic assembly is provided. The interface module includes a capture board having center conductor vias with center conductor holes extending through the capture board. Coaxial cables secured to the capture board have center conductors extending at least part way through a corresponding center conductor hole of the center conductor via. An interface component is adjacent the capture board, the conductor paths being conductively bonded to the conductor vias of the capture board so as to electrically connect center conductors to corresponding conductor paths. The conductor paths of the interface component are arranged to allow connection with an electronic assembly.

BRIEF DESCRIPTION OF THE DRAWINGS

The features and advantages of the present invention will be better understood with regard to the following description, appended claims, and accompanying drawings where:

DESCRIPTION

Tester Interface Module with Dual Printed Circuit Board Connector (FIGS. 1 through 3B)

Figure 1:
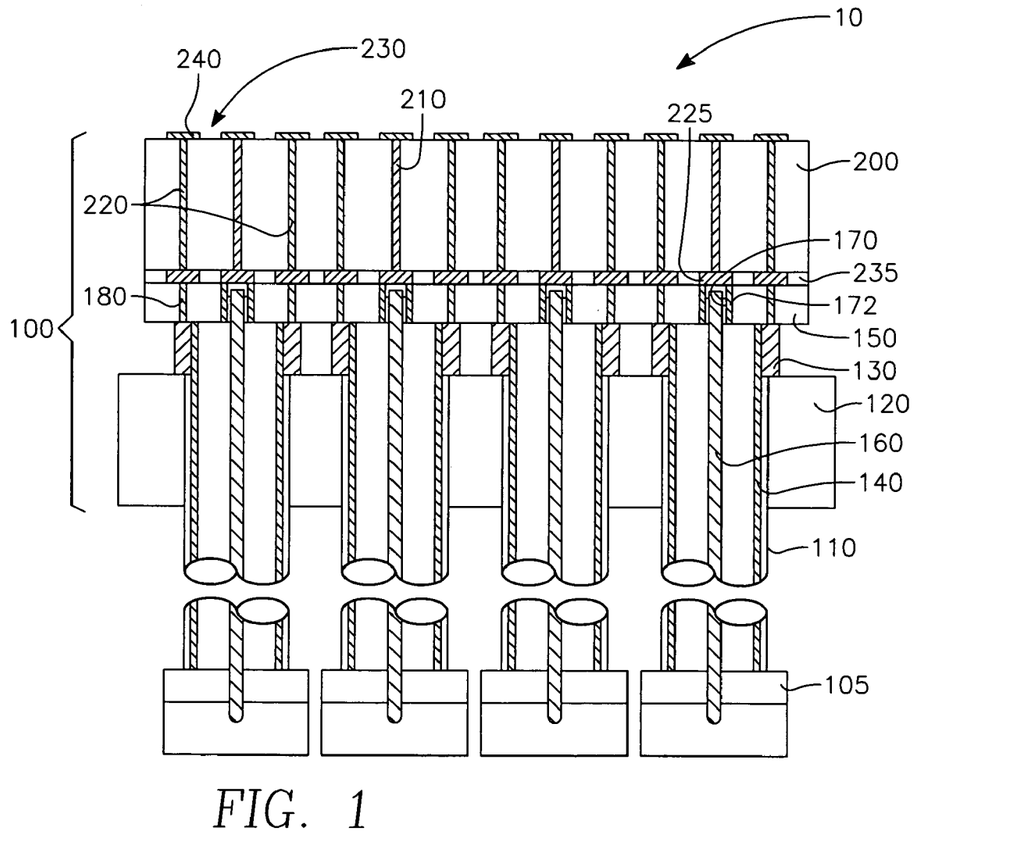
FIG. 1 is a cross sectional view of a simplified illustration of a tester interface module embodiment.

FIG. 1 is a cross sectional view of a simplified illustration of a tester interface module 10 embodiment. At one end is a dual printed circuit board connector 100. The dual printed circuit board connector 100 may contact an interposer (not shown), or other compliant connector for connecting to an electronic assembly. At the opposite end of coaxial cables 110 may be a standard connector such as an SMP, MCX, or other connector, depending on the application.

The dual printed circuit board connector 100 includes a capture board 150 stacked with an interface component (referred to as interface board 200 in this embodiment). Capture board 150 is between the interface board 200 and the coaxial cables 110. The interface board 200 provides an interface for mating with an electronic assembly, such as a DIB (not shown). The interface board 200 typically connects to pogo-pins or another compliant interposer (not shown). As discussed further below, in this embodiment the interface board 200 is provided with a substantially flat interface surface 230, which may include contact pads 240, so that the pogo-pins or other compliant interposer require only a very small amount of compliance. This allows high performance, low compliance interposers to be used.

A comb fixture 120 aligns the coaxial cables 110, and in some implementations functions to transfer bonding pressure (if applied), during the fabrication process discussed further below. The comb fixture 120 may be made of plastic, metal, or other material.

The comb fixture 120 abuts ferrules 130. The ferrules 130 surround the coaxial cables 110 and contact the coaxial return 140. Although the term "coaxial cable" is used herein for example purposes, the term is merely illustrative and intended to include axial cables in general including concentric cables such as coaxial cable, triaxial cable, or other multiaxial cable, as well as twinaxial cable, and non-concentric cable, and impedance controlled cable in general, or any assortment thereof. The term "return" is intended to mean shield, signal return, or ground conductor. For example, as used herein, a return may function as a shield, or a ground, in some cable embodiments.

Typically, the inside of the ferrules 130 are soldered to the outside of the coaxial return 140. In certain embodiments, the ferrules 130 may be held by, or partially recessed in the comb fixture 120. In other embodiments, the ferrules 130 abut a generally planar surface of the comb fixture 120. Press fitting the ferrules 130 into the comb fixture is possible, but not necessary. In some embodiments (not shown), the coaxial cables 110 may be held with epoxy, if desired, to further secure the coaxial cables 110, or to eliminate the need for the comb fixture 120.

The ferrules 130 are captured between the capture board 150 and the comb fixture 120. The ferrules 130 are electrically connected to return vias 180 extending through the capture board 150. In some embodiments, the ferrules 130 are bonded to the return vias 180 (or to return via pads not shown). In other embodiments, the ferrules 130 are press fit.

Center conductor vias 172 of the capture board 150 each have a conductor plating 175 with a center conductor hole 170 extending through the capture board 150. The center conductor hole 170 accommodates a center conductor 160 of a coaxial cable 110. The length of the center conductor 160 is such that it extends part way into a center conductor hole 170, in one embodiment without extending past the capture board 150. In other embodiments, not shown, the center conductor 160 may extend slightly past the capture board 150. A conductive bonding material 215, shown in FIG. 2, such as solder or conductive epoxy, mechanically affixes the center conductor 160 to the center via plating 175, and electrically connects the the center conductor 160 to center conductor via 210 of the interface board 200 through the bonding pads 225. In some embodiments, there may be multiple separate bonds (not shown), one between the center conductor 160 and a conductive plating 175, and another between the bonding pads 225 and the conductive plating 175.

The capture board 150 may be comprised of a printed circuit board. As a result, the structures on the printed circuit board may be formed through deposition and etching techniques that are well known in the industry and are relatively inexpensive.

The interface board 200 opposes the capture board 150. Extending through the interface board 200 are interface board return vias 220 and center conductor vias 210. The return vias 220 of the interface board 200 are electrically connected with corresponding return vias 180 of the capture board 150. An electrically conductive bonding material, such as solder, or conductive epoxy, may attach the return vias 180 of the capture board 150 with bonding pads 225 formed on the return vias 220 of the interface board 200.

The interface board 200 has a substantially flat interface surface 230. The interface surface 230 may be formed by cutting, milling, machining, grinding, polishing, a combination of these techniques, or similar techniques. The interface surface 230 may include contact pads 240. A typical printed circuit board manufacturing process for printed circuit board technologies may be utilized to plate the center conductor and return vias 210 and 220 of the interface board 200. The contact pads 240 may be gold, silver, copper, or other high performance conductor material. The contact pads 240 may contact an interposer (not shown) or other compliant connector for connecting the interface module to an electronic assembly, such as a DIB (not shown), for example. In this embodiment, because the interface surface 230 of the interface module comprises a printed circuit board substrate, forming surface structures on the printed circuit board through deposition and etching techniques, is straightforward and relatively inexpensive and can provide flat surfaces having about +/−4 mils or milli-inches, or less, of variation. Current implementations typically can provide about +/−1 mil of variation, or less.

Solder masks at 235 may be used to facilitate bonding of the capture board 150 with the interface board 200. Solder paste, solder balls, or conductive epoxy is used to bond the surfaces. The solder mask 235 is used to ensure that the solder balls, or other bonding agent are placed correctly, and flow in the right locations. The solder mask 235 provides a barrier for solder flow, so it may be used in conjunction with the different bonding methods discussed above, if desired. A solder mask 235 may be placed on the capture board 150 as well as on the interface board 200. Further, solder masks may be placed on both sides of the capture board 150, to facilitate bonding of the ferrules 130 with the capture board 150, as well as bonding of the interface board 200 with the capture board 150.

The interface board 200 may have bonding pads 225 on the center conductor vias 210 and the return vias 220 to facilitate the making of electrical connections with the capture board 150. Although not shown in FIG. 1, the capture board 150 may have bonding pads on the return vias (shown in FIGS. 3A and 3B), on both sides of the capture board 150.

Figure 2:
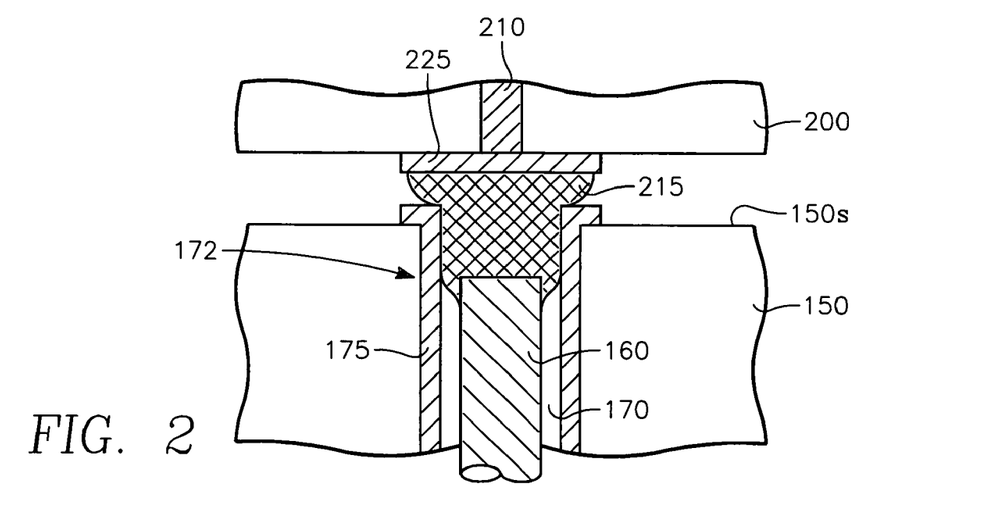
FIG. 2 shows an enlarged view of a cross section of a center conductor and interface board of one embodiment.

FIG. 2 shows an enlarged view of a cross section of a center conductor 160 and interface board 200 in accordance with one embodiment of the present invention. The center conductor 160 extends part way into the capture board 150 without extending out of the capture board 150. A bonding material, such as solder, conductive epoxy, or other flowable conductive bonding material 215 extends into the center conductor hole 170 to bond the bonding pad 225 with the center conductor 160.

In this embodiment, the center conductor via 172 of the capture board 150 is a hole 170 with conductor plating 175, as is known in the art. The conductive bonding material 215 contacts the center conductor 160 and the conductor plating 175 of the center conductor via 172 with the bonding pad 225. In some embodiments, the center conductor 160 also may be bonded to the center conductor plating 175 at the cable side (not shown in FIG. 2) of the capture board 150, to provide improved signal performance, and/or better retention.

Thus, in some embodiments the coaxial cables 110 are secured to the capture board 150 by bonding the center conductor 170. In other embodiments not shown, conductive bonding material may connect the center conductor 170 to the conductor plating 175 at/from the coaxial cable side of the capture board 150, if desired. In yet other embodiments, the ferrule secures the coaxial cables 110 to the capture board 150 by bonding, and/or by an interference fit (not shown). In some embodiments, the return conductors 140 may be bonded directly to the return vias 180 (or other conductor path). In still other embodiments, the comb fixture 120 and/or an epoxy, or the like may be used. Combinations of the above mechanisms may be used to secure the coaxial cables 110 to the capture board 150.

In yet another embodiment not shown, the center conductor 160 may be bonded to the conductive plating 175 with a separate bond from a bond that connects the conductive coating 175 with the bonding pad 225. Thus, the bond 215 shown in FIG. 2 may be two separate bonds, one contacting the center conductor 160 with the conductor plating 175 and another connecting the bonding pad 225 of the interface board 200 with the conductive plating 175 (which may extend laterally along the capture board surface 150s).

Figure 3A:
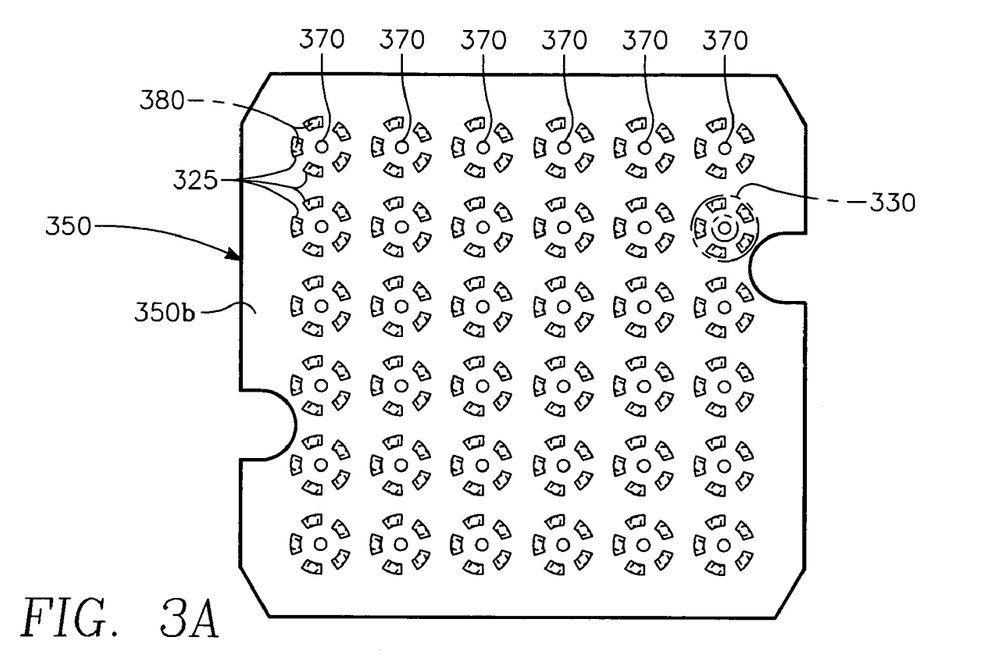
FIGS. 3A and 3B show bottom and top views of a capture board of one embodiment.
Figure 3B:
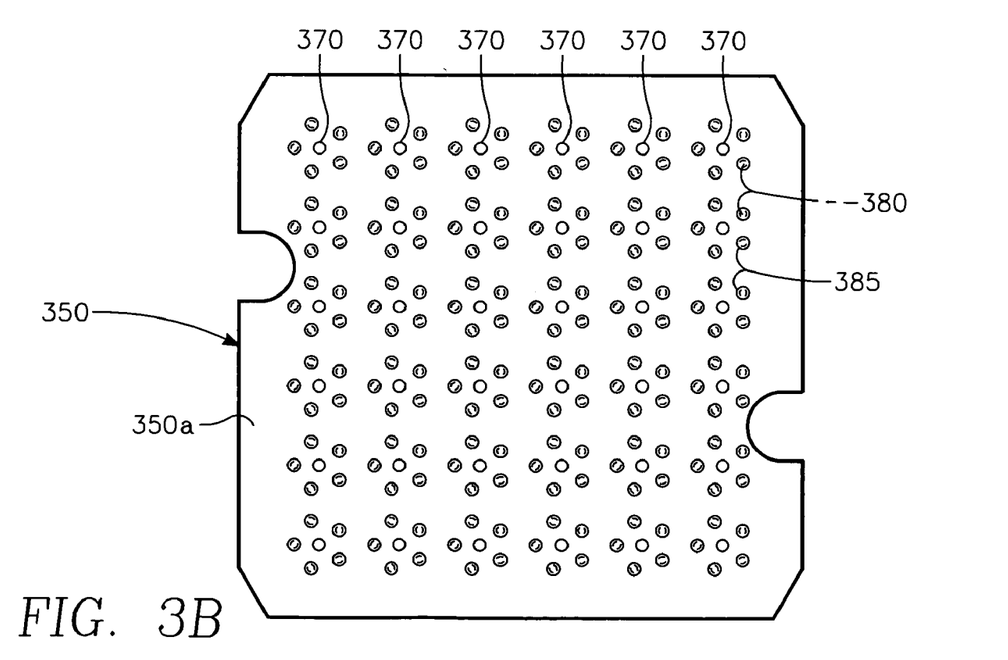

FIGS. 3A and 3B show bottom and top views of a capture board 350, respectively. In FIG. 3A, the ferrule side 350a of the capture board 350 is shown with center conductor holes 370 surrounded by return vias 380. Ferrule contact pads 325 are on the return vias 380. In this embodiment, the ferrule contact pads 325 are located in a ring arrangement around a respective center conductor hole 370. A ferrule (not shown) may be mounted as shown in phantom outline at 330. The ferrule contact pads 325 are segmented to provide radially extending channels as a means for allowing any gasses and residues from the center conductor hole 370 to escape during the bonding process. A continuous ring contact pad (not shown) is possible but could trap undesirable residues and/or outgases within it without escape openings in the ferrule. Residues could degrade the solder bond connection (not shown in FIGS. 3A and 3B), or otherwise affect the electrical properties. Thus, in some embodiments the ferrule, its contact pad(s), and/or the printed circuit board may have one or more slits, holes, grooves, channels, notches, spaces, segments, or other openings as a means to allow outgassing.

Matching the characteristic impedance of the signal path through the connector 100 is important to avoid signal reflections. Via placement, size, number, and configuration are variables to adjust through simulation and/or testing to achieve a matched impedance with impedance controlled cables, for example 50 ohm characteristic impedance, through the connector 100. In this embodiment five return vias 380 with corresponding ferrule contact pads 325 have an inner radius of about 0.03 inches and an outer radius of about 0.05 inches are provided surrounding each center conductor hole 370 to provide a 50 ohm impedance. In this embodiment the pitch or radial distance of the return vias 380 from the center conductor hole 370 is about 0.15 inches from center to center. Many different configurations are possible to achieve impedance matching at 50 ohms, or at another selected impedance value. Further, the type, size, or amount of electrical bonding material is selected to facilitate impedance matching through the connector 100.

FIG. 3B shows the interface board side 350b of the capture board 350. The center conductor hole 370 is surrounded by return vias 380 having pads 385 thereon. It is not necessary that the pads 385 be equally sized and symmetrically placed about the center conductor hole 370. In some embodiments, several return vias 380 may connect with a single pad (not shown), which may extend laterally to the side, or radially away from the return vias 380 to facilitate connection with various embodiments of the interface board.

Methods of Fabrication (FIGS. 1 through 6)

Referring to FIG. 1, in this implementation, prior to insertion in the comb fixture 120, the ends of the coaxial cables 110 are stripped to expose portions of the center conductor and the return conductor (not shown). Next, ferrules 130 are mounted and soldered to the coaxial return conductors 140. Typically the coaxial return conductors 140 are tinned prior to insertion in the ferrules 130 to ease soldering. The ferrules 130 are seated against the comb fixture 120 and the coaxial cables 110 are length matched with connectors 105 being placed at the opposite end. A time domain reflectometer or TDR, or a vector network analyzer or VNA, may be used for this purpose.

An optional cutting block (not shown) may be used to gage the proper length for cutting the center conductors. For example, the ferrules 130 may be seated within ferrule sized bores in the cutting block, so that the ferrules 130 seat against an inside surface of a gage plate portion of the block. The center conductors 160 may extend through conductor sized holes in the gage plate so that they may be trimmed against the outside back surface of the gage plate. The thickness of the gage plate determines the length of the center conductor 160 beyond the ferrules 130.

The size of the gage plate is selected so that the length of the center conductors 160 does not exceed the length of the center conductor holes 170 in the capture board 150. In certain embodiments, the length of the center conductor 160 is selected so as to provide sufficient tolerances to ensure the center conductors 160 do not extend past the interface board side 150s (shown in FIG. 2) of the capture board 150. In some embodiments, the center conductor 160 may extend past the interface side 150s of the capture board 150, and trimmed after being inserted into the capture board 150.

The comb fixture 120 holds and aligns the cables for insertion of the center conductors 160 into the capture board 150. It may also be used to hold the ferrules 130 against the ferrule contact pads 325 (shown in FIG. 3A) during solder, or conductive epoxy bonding of the ferrules 130 with the ferrule contact pads 325, if desired. The comb fixture 120 may be fastened to the coaxial cables 110, such as with epoxy, or other adhesive, if desired. In alternate embodiments, the comb fixture 120 may be removed, and the coaxial cables 110 secured with other means, such as for example with epoxy, hot glue, plastic, or the like.

Referring to FIGS. 3A and 3B, in one implementation solder masks (not shown) are placed on both sides 350a and 350b of the capture board 350. Solder paste (not shown) may be placed on the ferrule contact pads 325. Referring to FIG. 1, after the solder paste is applied, the capture board 150 is seated against the ferrules 130, with the center conductors 160 extending part way through the center conductor holes 170. In some embodiments, it is possible to laser weld the ferrules 130, or the return conductors 140, to the capture board 150.

Figure 4:
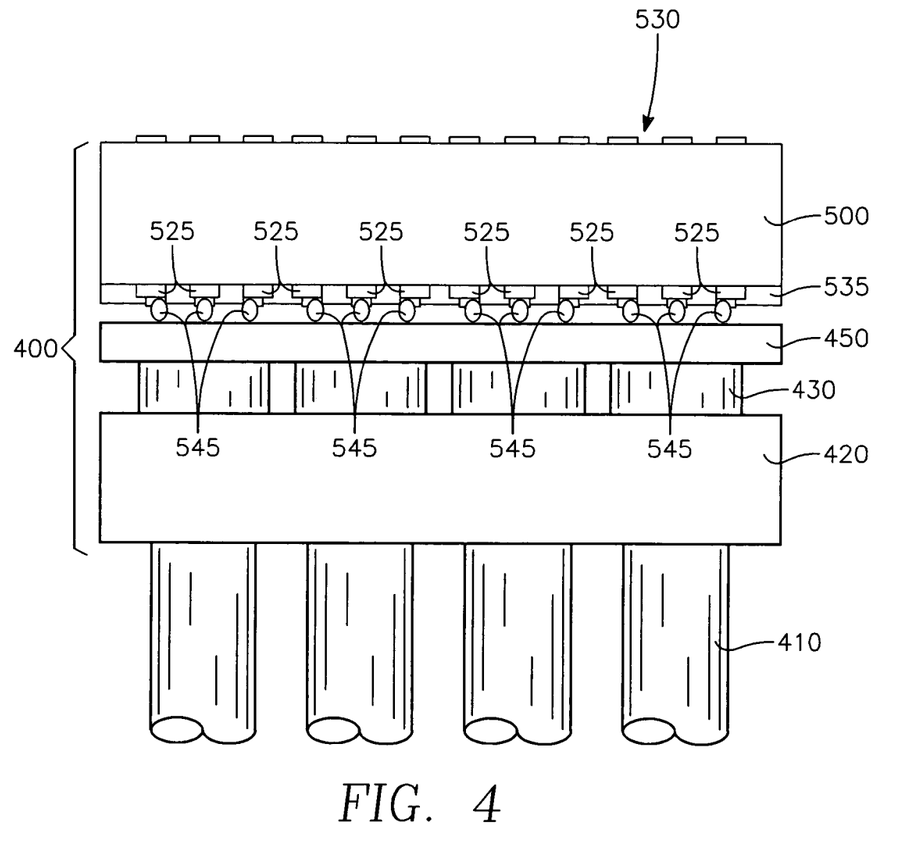
FIG. 4 shows a partial side view of a partially fabricated dual printed circuit board at one end of the assembly tester interface module in accordance with one implementation.

Turning to FIG. 4, shown is a side view of a partially fabricated dual printed circuit board connector 400 at one end of the assembly tester interface module in accordance with one implementation of the present invention. A typical printed circuit board manufacturing process may be utilized to plate the center conductor and return vias 210 and 220 (shown in FIG. 1) of the interface board 500. As the interface surface 530 of the interface board 500 comprises a printed circuit board substrate, forming surface structures (trace and contact pads) on the interface board is well known in the industry and relatively inexpensive using deposition and etching techniques. Because the center conductor 160 (shown in FIG. 1) does not extend to the interface surface 530, it is not necessary to spend time and money lapping the center conductor 160 at the interface surface 530 to provide the requisite tolerance for high frequency applications. Instead, standard printed circuit board processes may be used to provide a precision interface surface for high frequency applications. For example, low compliance interposers typically only have about 5–15 mils of compliance. Thus, in certain embodiments, a standard printed circuit board filling and plating process is able to provide sufficient surface flatness for use with low compliance interposers. The dual printed circuit board connector can provide an inexpensive and easily manufactured interface module for use as a high performance electrical connection typically used in automated test equipment.

Shown in FIG. 4, solder balls 545 are placed on bonding pads 525 within a solder mask 535 on the capture board side of the interface board 500. The interface board 500 is then seated on the capture board 450. A solder mask (not shown) and solder balls (not shown) may be placed on the capture board 450 between the capture board 450 and the ferrules 430. Thus, the ferrules 430 (and coxial cables 410) may be secured to the capture board 450 prior to mounting with the interface board 500, if desired.

Figure 5:
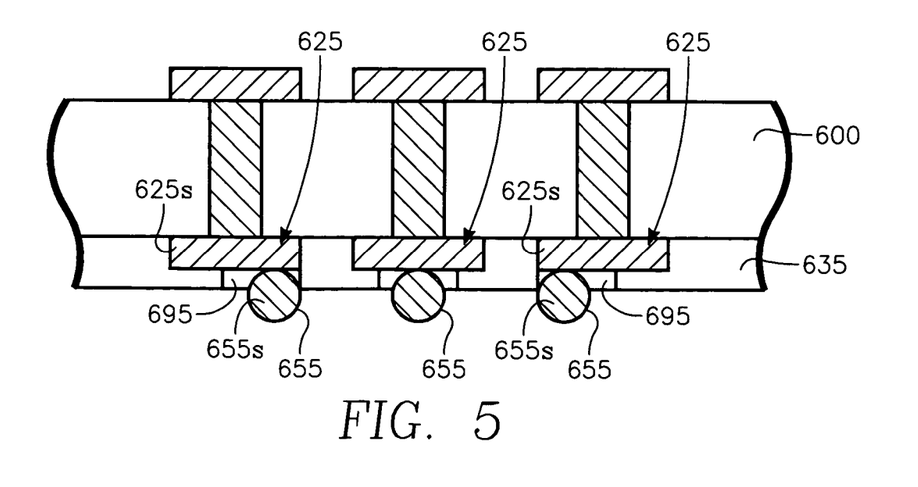
FIG. 5 shows an enlarged side view of a portion of the interface board during one fabrication implementation.

FIG. 5 shows an enlarged side view of a portion of the interface board 600 during one fabrication method in accordance with one implementation of the present invention. In this implementation, solder balls 655 are utilized to bond the interface board 600 to the capture board (not shown in FIG. 5). In some embodiments, the size and placement of the openings of solder mask 635 on the pads 625 may be used to create the desired impedance, i.e. 50 ohms. Thus, the solder mask placement, solder ball pitch, along with the solder type, the number of return vias, and the return via spacing, may be varied to tailor the impedance of the connector. The solder mask 635 may be used to mask portions of the pads 625. The selection of the proper combinations may be accomplished through simulation or by empirical means.

In one embodiment, as shown in FIG. 5, the present inventors have found that placing the return pad solder balls 655s near an the inside edge of the return pads 625s, and leaving an air space 695 near an exterior edge of the pad 625s, creates a sufficient amount of additional capacitance to provide the connector with a 50 ohm impedance.

Referring to FIG. 1, in one embodiment, the capture board 150 is about 30 mils thick, and the center conductor via 172 of the capture board 150 is 18 mils diameter, with the center conductor vias 210 of the interface board 200 having 18 mils diameter, and the interface board 200 being 125 mils thick.

Figure 6:
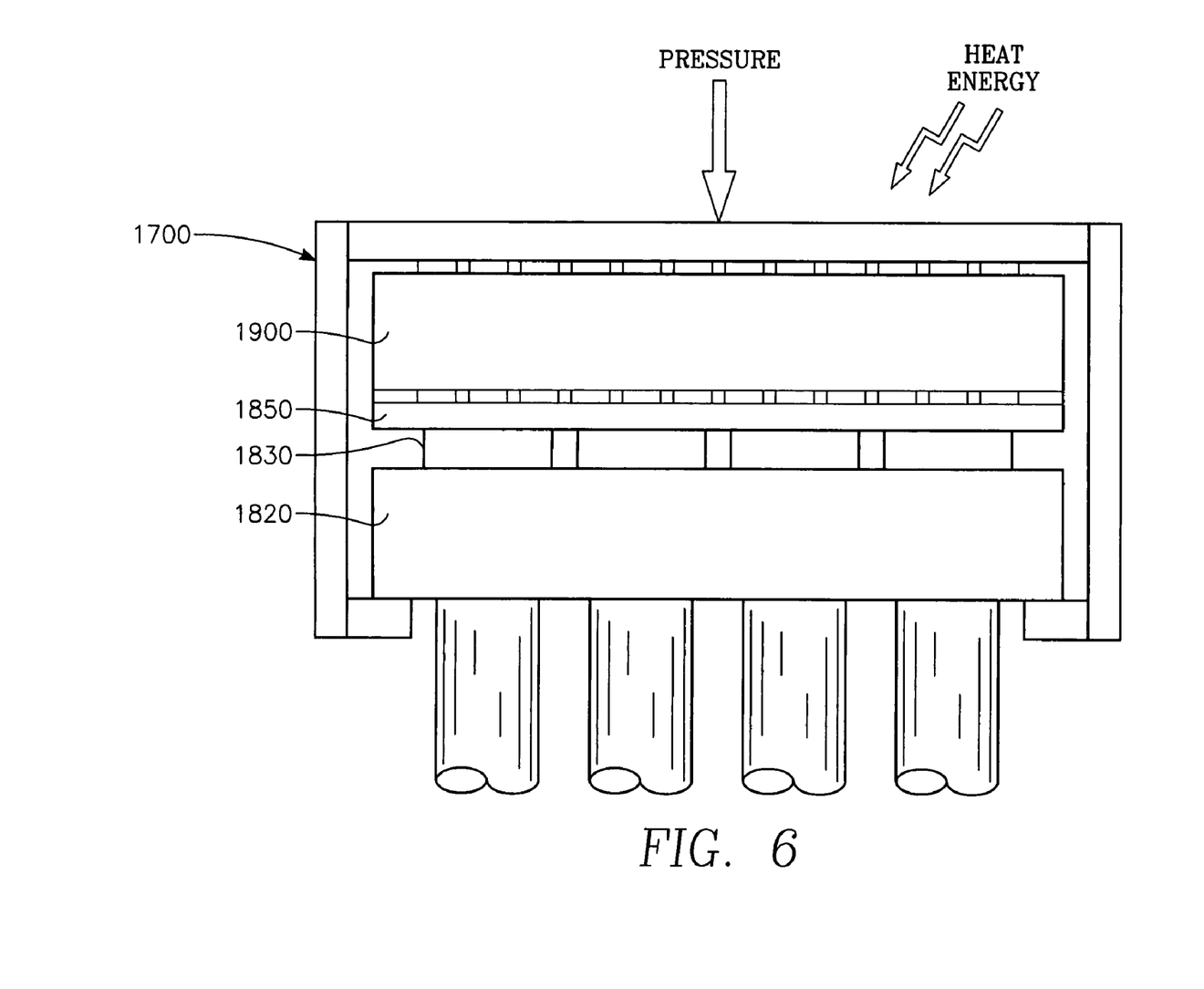
FIG. 6 shows a partial side view of a tester interface module during one fabrication implementation.

Turning to FIG. 6, shown is side view of the dual printed circuit board connector during one fabrication method in accordance with one implementation of the present invention. In one implementation, an amount of heat energy is applied to soften the solder balls and/or paste prior to applying pressure to the connector. A clamp 1700 may be used to apply pressure across the comb fixture 1820, the ferrules 1830, the capture board 1850, and the interface board 1900 to form the solder bonds.

In some implementations, hot air may be applied to heat the solder in the connector prior to applying pressure to the connector. After the solder has softened to at, or near its melting point, pressure is applied, such as with the clamp 1700, or by other means, to form the solder bonds. It is possible in some implementations, however, to solder the ferrules 1830, the capture board 1850, and the interface board 1900 together in separate steps rather than soldering them all together at one time. In some implementations, the bond may be formed by conductive epoxy, laser welding, etc.

ADDITIONAL EMBODIMENTS FIGS. 7 THROUGH 11

The present invention is not limited to a dual printed circuit board configuration illustrated in FIG. 1. In other embodiments, the interface component may be a printed circuit board adapted for surface mount components, an interposer, a connector block, a flexible circuit, etc. The interface component provides connection of the signals from the axial cables to an electronic assembly, such as surface mount components, interface component(s), other cabling, connectors, printed circuit boards, etc. Further, the vias discussed above may be other conductor paths such as surface conductors and/or other pass through conductors. Thus, the capture board may be bonded to an interposer, a connector block, a flexible circuit, or the like. FIGS. 7 through 11 illustrate some possible additional embodiments. Other embodiments are possible.

Figure 7:
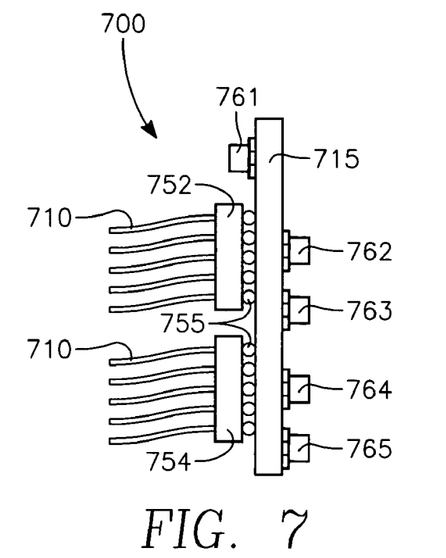
FIG. 7 is a simplified illustration in partial side view of a possible embodiment of a tester interface module.

FIG. 7 is a simplified illustration in partial side view of an embodiment of a tester interface module 700. In some embodiments, several capture boards 752 and 754 may be mounted to an interface component 715, which may be an interface board as discussed above. In this embodiment, the capture board 752 is secured to an interface component 715. In this embodiment, several capture boards 752 and 754 may be mounted to the interface component 715. In the illustrated embodiment of FIG. 7, surface mount electrical devices 761–765 may be mounted to the interface component 715. Electrical signals may be supplied through the cables 710 to the surface mount devices 761–765 mounted on the interface component 715. Solder balls 755 may be used to solder bond the capture boards 752 and 754 to the interface component 715 as discussed above.

Figure 8:
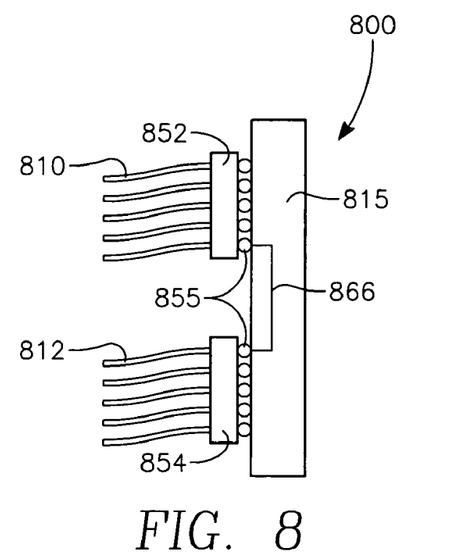
FIG. 8 is a simplified illustration in partial side view of a possible embodiment of a tester interface module.

FIG. 8 is a simplified illustration in partial side view of an embodiment of a tester interface module 800. In this embodiment, a first capture board 852 is mounted to an interface component 815. Solder balls 855 may be used to solder bond the capture board 852 to the interface component 815, as discussed above. Electrical signals from cables 810 are routed through the interface component 815 to a second capture board 854 (or other electronic assembly) with signal traces (a signal trace 866 is illustrated for example purposes), to cables 812. Many signal traces could be used.

Figure 9:
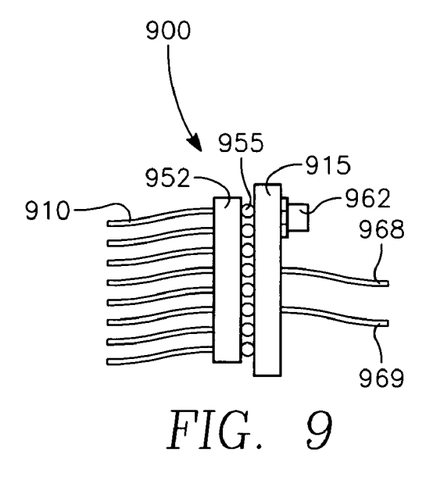
FIG. 9 is a simplified illustration in partial side view of a possible embodiment of a tester interface module.

FIG. 9 is a simplified illustration in partial side view of an embodiment of a tester interface module 900. In this embodiment, the capture board 952 is mounted to an interface component 915. Solder balls 955 may be used to solder bond the capture boards 952 to the interface component 915, as discussed above. A surface mount electrical device 962 is mounted on the interface component 952 along with cables 968 and 969. Thus, signals from cables 910 may be routed through the interface component 952 to the surface mount electrical device 962 and/or to cables 968 and 969.

Figure 10:
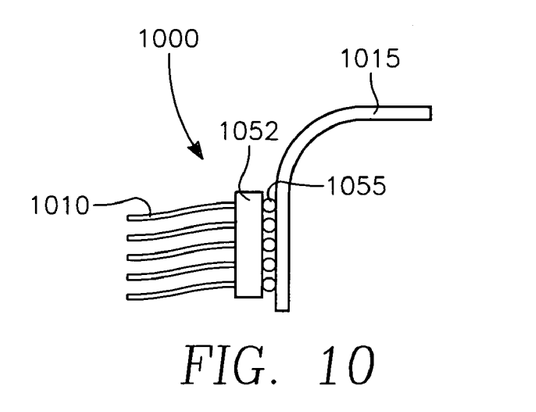
FIG. 10 is a simplified illustration in partial side view of a possible embodiment of a tester interface module.

FIG. 10 is a simplified illustration in partial side view of an embodiment of a tester interface module 1000. In this embodiment, the capture board 1052 is mounted to an interface component 1015, illustrated as a flexible circuit board. Solder balls 1055 may be used to solder bond the capture board 1052 to the flexible circuit board interface component 1015, as discussed above. Signals from conductors 1010 may be routed through the interface component 1015 to another circuit, board, device, or other electronic assembly (not shown).

Figure 11:
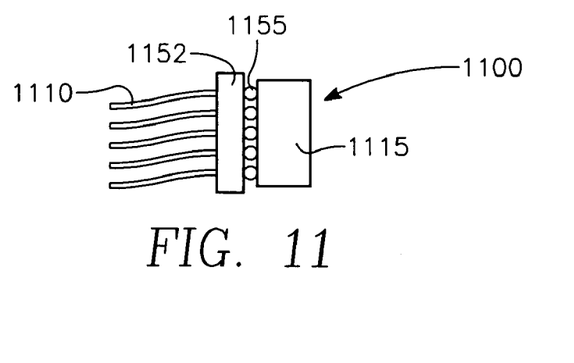
FIG. 11 is a simplified illustration in partial side view of a possible embodiment of a tester interface module.

FIG. 11 is a simplified illustration in partial side view of an embodiment of a tester interface module 1100. In this embodiment, the capture board 1152 is mounted to an interface component 1115, illustrated as a connector block. The connector block may be a standard connector, such as a NEXLEV, by Teradyne, Inc., Boston, Mass., or a SAM ARRAY by Samtec USA, New Albany, Ind., www.samtec.com. Solder balls 1155 may be used to solder bond the capture board 1152 to the connector block interface component 1115, as discussed above. Signals from conductors 1110 may be routed through the interface component 1115 to another connector, interposer, circuit, board, device, or other electronic assembly (not shown).

In some embodiments, the solder mask discussed above may be placed on the capture board rather than on the interface component, if desired. Solder balls are shown in FIGS. 7 through 11 for illustration purposes. Other conductive bonding methods are possible.

Having described this invention in connection with a number of embodiments, modifications will now certainly suggest itself to those skilled in the art. As such, the invention is not limited to the disclosed embodiments, except as required by the appended claims. One or more of the embodiments above may have one or more of the advantages discussed above. There may be other advantages that become evident upon reading of the description.

What we claim is:

1. A tester interface module for connecting a plurality of signal paths from an electronic assembly to at least one other electronic assembly, the interface module comprising:
    a) a capture board comprising center conductor vias having center conductor holes extending through the capture board;
    b) axial cables each comprising at least one center conductor extending at least part way through a corresponding center conductor hole of the center conductor via, the axial cables being secured to the capture board;
    c) an interface component electrically bonded to the capture board, the interface component comprising conductor paths arranged to allow connection with an electronic assembly; and
    d) a conductive bond electrically connecting each of the center conductor vias with a corresponding conductor path of the interface component.

2. The tester interface module of claim 1 further comprising:
    a) an axial cable return conductor associated with each of the axial cables;
    b) wherein the capture board comprises return vias disposed around each of the center conductor holes;
    c) a ferrule around each of the axial cables connecting the return conductor of the axial cable with respective ones of the return vias.

3. The tester interface module of claim 2, wherein the capture board further comprises ferrule contact pads.

4. The tester interface module of claim 3, wherein the ferrules are electrically bonded to the ferrule contact pads.

5. The tester interface module of claim 4, wherein the at least one center conductor of the axial cables is electrically bonded to the interface component.

6. The tester interface module of claim 5 further comprising a means for allowing outgassing during solder bonding of a ferrule to a ferrule contact pad.

7. The tester interface module of claim 5, wherein the ferrule contact pads comprise segmented sections.

8. The tester interface module of claim 5, wherein the ferrules comprise openings.

9. The tester interface module of claim 1, wherein the interface component comprises at least one of: (a) printed circuit board; (b) an interposer; (c) a connector; (d) a flex circuit; or (e) another capture board.

10. The tester interface module of claim 1, wherein the conductive bond electrically connects each of the at least one center conductors with the corresponding conductor path of the interface component.

11. A tester interface module for connecting a plurality of signal paths from at least one electronic assembly to at least one other electronic assembly, the interface module comprising:
    a) a capture board comprising:
        (i) center conductor holes extending therethrough; and
        (ii) return vias extending therethrough;
    b) axial cables each comprising:
        (i) a center conductor comprising an end extending into a corresponding center conductor hole; and
        (ii) a return conductor;
    c) a ferrule surrounding each axial cable and electrically connecting the return conductor of each axial cable to respective ones of the return vias, each ferrule being conductively bonded with respective ones of the return vias;

d) an interface component mounted to the capture board, the interface component comprising conductor paths configured to allow connection with an electronic assembly; and e) a conductive bond electrically connecting each of the center conductors with a corresponding conductor path of the interface component.

12. The tester interface module of claim 11, wherein the interface component comprises a printed circuit board comprising:

a) a capture board side;

b) an interface side comprising contact pads thereon and having a substantially flat surface;

c) wherein the conductor paths comprise:
   (i) center conductor vias extending from the capture board side to corresponding ones of the contact pads; and
   (ii) return vias each extending from the capture board side to a corresponding contact pad; and d) the conductive bond electrically connecting a center conductor with a corresponding center conductor via.

13. The tester interface module of claim 11, wherein the capture board further comprises ferrule contact pads on the return vias, the ferrule contact pads comprising segmented sections.

14. The tester interface module of claim 13, wherein the ferrules are soldered to the ferrule contact pads.

15. The tester interface module of claim 11, wherein the capture board further comprises ferrule contact pads on the return vias and further comprising a means for allowing outgassing during solder bonding of the ferrule to the ferrule contact pads.

16. The tester interface module of claim 11 further comprising a comb fixture holding the axial cables, the comb fixture abutting the ferrules.

17. The tester interface module of claim 11 further comprising epoxy holding the axial cables.

18. The tester interface module of claim 11 further comprising a solder mask on the capture board side of the interface component.

19. The tester interface module of claim 18, wherein the interface component further comprises contact pads on a capture board side of the interface component, the solder mask extending over portions of the contact pads.

20. The tester interface module of claim 11, wherein the capture board comprises an interface component side opposing the interface component, and wherein the center conductor extends near the interface component of the capture board without extending beyond the interface component side of the capture board.

21. The tester interface module of claim 11, wherein the return vias of the capture board comprise sets of return vias associated with each of the center conductor holes.

22. The tester interface module of claim 11, wherein the center conductor holes each comprise a conductor plating, and wherein the conductive bonds electrically connect a center conductor with corresponding conductor plating.

23. The tester interface module of claim 11, wherein the conductive bond connecting the ferrule comprises at least one of: (a) a solder bond; (b) a conductive epoxy; or (c) a weld, and wherein the conductive bonds electrically connecting center conductors comprise at least one of: (a) solder; (b) conductive epoxy; or (c) a weld.

24. The tester interface module of claim 11, wherein the interface component comprises one of: (a) a printed circuit board; (b) an interposer; (c) a connector; (d) a flexible circuit; or (e) another capture board.

25. A tester interface module for connecting a plurality of signal paths from an electronic assembly to an other electronic assembly, the interface module comprising:

a) a capture board comprising:
   (i) center conductor vias extending through the capture board, the center conductor vias comprising center conductor holes each comprising a conductor plating; and
   (ii) return vias extending through the capture board;

b) axial cables secured to the capture board, each of the axial cables comprising:
   (i) a center conductor comprising an end extending into a corresponding center conductor hole of the capture board; and
   (ii) a return conductor;

c) an interface board comprising:
   (i) center conductor vias extending through the interface board; and
   (ii) return vias extending through the interface board;

d) a ferrule around each of the axial cables connecting the return conductor of each axial cable with respective ones of the return vias of the capture board; and e) a conductive bond electrically connecting the end of each center conductor with a corresponding conductor plating of a capture board center conductor via and with a corresponding center conductor via of the interface board.

26. The tester interface module of claim 25, wherein the capture board further comprises ferrule contact pads on the return vias of the capture board and comprising therewith a means for allowing outgassing during solder bonding of the ferrule to the ferrule contact.

27. The tester interface module of claim 25 further comprising ferrule contact pads on a cable side of the capture board, the ferrule contact pads comprising segmented sections.

28. The tester interface module of claim 25, wherein the ferrule is soldered to a corresponding ferrule contact pad.

29. The tester interface module of claim 25 further comprising a solder mask on the capture board side.

30. The tester interface module of claim 29, wherein the interface board further comprises contact pads on a capture board side of the interface board, the solder mask extending over portions of the contact pads.

31. The tester interface module of claim 25, wherein the capture board comprises an interface board side, and wherein the center conductor extends near the interface board side of the capture board without extending out of the center conductor hole.

32. The tester interface module of claim 25, wherein the conductive bonds electrically connect a center conductor with corresponding conductor plating of a capture board center conductor via and with a corresponding one of the center conductor vias.

33. The tester interface module of claim 25, wherein the conductive bond comprises one of: (a) a solder bond; (b) a conductive epoxy; (c) a weld.

34. The tester interface module of claim 25, wherein the capture board is a printed circuit board, and wherein the interface board is a printed circuit board.

35. The tester interface module of claim 25, wherein the interface board comprises a printed circuit board comprising:

a) a capture board side comprising contact pads thereon;

b) an interface side comprising contact pads thereon and having a substantially flat surface;

c) wherein the center conductor vias each extend from a contact pad on the capture board side to a corresponding contact pad on the interface side;
d) wherein the return vias of the interface board each extend from a contact pad on the capture board side to a corresponding contact pad on the interface side; and
e) wherein solder bonds electrically connect a center conductor with a corresponding center conductor via contact pad.

36. The tester interface module of claim 25 further comprising a comb fixture adjacent the ferrules holding the axial cables.

37. Automated test equipment comprising:
a) tester electronics;
b) a device interface board comprising a tester interface module connecting the tester electronics with the device interface board, the tester interface module comprising:
  (i) a capture board comprising:
    (1) center conductor holes extending therethrough; and
    (2) return vias extending therethrough;
  (ii) axial cables each comprising:
    (1) a center conductor comprising an end extending part way through a corresponding one of the center conductor holes; and
    (2) a return conductor;
  (iii) a ferrule surrounding each of the axial cables and electrically connecting the return conductor of the axial cables with a respective return via;
  (iv) a conductive bond connecting the ferrule with a respective return via;
  (v) an interface component mounted with the capture board, the interface component comprising conductor paths; and
  (vi) conductive bonds electrically connecting center conductors with corresponding conductor paths of the interface component.

\* \* \* \* \*